United States Patent
Sengupta et al.

(10) Patent No.: US 7,834,698 B2
(45) Date of Patent: Nov. 16, 2010

(54) AMPLIFIER WITH IMPROVED LINEARIZATION

(75) Inventors: Susanta Sengupta, Leander, TX (US); Kenneth Charles Barnett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 109 days.

(21) Appl. No.: 12/126,189

(22) Filed: May 23, 2008

(65) Prior Publication Data

US 2009/0289715 A1    Nov. 26, 2009

(51) Int. Cl.
*H03F 3/45* (2006.01)
(52) U.S. Cl. ........................ 330/261; 330/253
(58) Field of Classification Search .......... 330/261, 330/257, 253
See application file for complete search history.

(56) References Cited

U.S. PATENT DOCUMENTS

| | | | |
|---|---|---|---|
| 6,614,301 B2 * | 9/2003 | Casper et al. | ............... 330/253 |
| 6,972,624 B1 | 12/2005 | Stroet | |
| 7,176,759 B2 * | 2/2007 | Joos et al. | ................... 330/253 |
| 7,268,625 B2 | 9/2007 | Shin | |
| 7,279,924 B1 | 10/2007 | Shumarayev | |
| 7,382,197 B2 | 6/2008 | Iyer | |
| 2007/0229154 A1 | 10/2007 | Kim et al. | |

OTHER PUBLICATIONS

International Search Report and Written Opinion—PCT/US2009/045065, International Search Authority—European Patent Office—Sep. 2, 2009.

* cited by examiner

*Primary Examiner*—Henry K Choe
(74) *Attorney, Agent, or Firm*—Jiayu Xu

(57) ABSTRACT

According to some embodiments, an amplifier may include a transconductance stage, a tail current source stage, and an adaptive biasing stage. The transconductance stage may be configured to receive an input voltage. The tail current source stage may be configured to provide current to the transconductance stage. The adaptive biasing stage may capacitively couple the transconductance stage to the tail current source stage.

37 Claims, 6 Drawing Sheets

AMPLIFIER WITH IMPROVED LINEARIZATION

FIELD OF DISCLOSURE

The present disclosure relates generally to circuits, and more specifically to an amplifier suitable for wireless communication and other applications.

BACKGROUND

Amplifiers are commonly used in various electronic devices to provide signal amplification. For example, a receiver in a wireless communications system may include a low noise amplifier (LNA) to amplify a low-amplitude signal received via a communication channel. The LNA is often the first active circuit encountered by the received signal and hence may significantly impact the performance of the receiver. Accordingly, nonlinearities may impact the design of (and often place more stringent requirements on) subsequent stages in order to meet the overall performance requirements for the receiver. Thus, among other advantages, having a more linear LNA can alleviate the performance requirements for other stages, which may result in lower power consumption and smaller circuit area for the receiver.

The linearity of a receiver (or the active devices therein) can be characterized by the input-referred third-order intercept point (IIP3). Typically, an output radio frequency (RF) signal and third-order intermodulation products are plotted versus the input RF signal. As the input RF signal is increased, the IIP3 is a theoretical point where the desired output RF signal and the third-order products become equal in amplitude. The IIP3 is an extrapolated value since the active device goes into compression before the IIP3 point is reached.

Various circuits have been devised to improve the IIP3 of common amplifiers, such as LNAs. For example, a modified derivative superposition (MDS) scheme has been shown to work well in silicon, achieving an IIP3 greater than +10 dBm. MDS is described in more detail, for example, in Vladimir Aparin and Lawrence E. Larson, "Modified Derivative Superposition method for Linearizing FETs for Low-Noise Amplifiers," IEEE Trans. On Microwave Theory and Techniques, Vol. 52, No. 3, February 2005, pp. 571-581. However, one of the limitations of this scheme is its narrow-band frequency operating region, making it undesirable for wideband applications, such as TV tuners, ultra wide band systems, etc. In a post distortion (PD) scheme, the non-linearity of one device is countered by another device. PD schemes are described in more detail, for example, in Namsoo Kim et al., "A Cellular-band CDMA 0.25 um CMOS LNA Linearized using Active Post-Distortion," IEEE JSSC, Vol. 41, No. 7, July 2006, pp. 1532-1536. However, this scheme is also sensitive to frequency, making it undesirable for wideband applications as well. In an adaptive-biasing scheme, a transconductance ($g_m$) stage uses a tail current that is changed based on the input voltage. This scheme is described in more detail, for example, in S. Sengupta, "Adaptively-biased Linear Transconductor," IEEE CAS-I, Vol. 52, No. 11, November 2005, pp. 2369-2375. Conventional adaptively biased amplifiers are wideband in nature, but suffer from common-mode rejection ratio (CMRR) problems.

FIG. 1 illustrates an example conventional adaptively biased, differential pair amplifier circuit. As shown, amplifier 100 includes a $g_m$ stage 110, a current buffer stage 120, a tail current source stage 130, and an adaptive biasing circuit 160. The $g_m$ stage 110 includes two transistors 112 and 114 (e.g., JFETs), which are referred to as M1 and M2, respectively. An input voltage Vin may be applied differentially to the gates of M1 and M2. For example, in FIG. 1 +Vin/2 is applied to the gate of M1, and −Vin/2 is applied to the gate of M2. The current buffer stage 120 includes cascade transistors 122 and 124 (e.g., JFETs), which are referred to as M3 and M4, respectively. Together, M3 and M4 make up a cascading pair. The tail current source stage 130 includes two tail current source transistors 132 and 134 (e.g., JFETs), which are referred to as M5 and M6, respectively. The adaptive biasing circuit 160 provides a DC biasing voltage to the gates of transistors M5 and M6, respectively. The adaptive biasing circuit 160 includes level shifters 162 and 164 that tap outputs of amplifier 100 (i.e., the connections between transistors M3 and M1, and the connections between transistors M4 and M2, respectively), and feed them back as a voltage reference Vsh to the tail current source stage 130 (i.e., to the gates of transistors M5 and M6, respectively). Level shifters 162 and 164 may be implemented using simple source followers, for example. Amplifier 100 also includes loads 102 and 104. Loads 102 and 104 therefore provide an impedance to convert the current in amplifier 100 to an output voltage, and may be implemented as resistors, inductors, etc.

Amplifier 100 is wired such that loads 102 and 104 are coupled to a common power supply voltage VDD at a first terminal, and to the drains of M3 and M4, respectively, at a second terminal. An output voltage Vout may be tapped from one of the second terminals of loads 102 and 104. For example, in FIG. 1, the connection between the second terminal of load 104 and the drain of M4 is tapped to provide +Vout, and the connection between the second terminal of load 102 and the drain of M3 is tapped to provide −Vout. The gates of M3 and M4 each receive the same biasing voltage VDD. The sources of M3 and M4 are connected to the drains of M1 and M2, respectively. The gates of M1 and M2 are connected differentially to the input voltage Vin as described above. The sources of M1 and M2 are tied together and connected to the drains of M5 and M6. As described above, the gates of M5 and M6 are connected to the feedback reference voltages Vsh provided by the level shifters 162 and 164. In this configuration, each of the six transistors M1 through M6 are matched and have their bulks connected to their sources.

Because M1 and M3 are matched and conduct equal amounts of current, their gate-to-source voltages (Vgs) are essentially equal. Similarly, the Vgs voltages of M2 and M4 are equal. Therefore, the voltage difference at the sources of M3 and M4 is equal to the differential input voltage Vin. These source voltages are fully-balanced even if the input signal is single ended due to the common-mode rejection of the differential pair M1 and M2. In this design, Vsh is adjusted such that the Vgs(M1)=Vgs(M3)=Vgs(M5). Thus, the balanced version of Vin is copied to the gate voltages of M5 and M6 by the level shifters 162 and 164, respectively.

It can be shown that the sum of the drain currents in M5 and M6 contain quadratic dependencies for nonlinearity cancellation. Furthermore, the DC operating current is determined by VDD and the feedback reference voltages Vsh, independent of the common-mode input level. In addition, fully-balanced signals are not required. The noise generated by the components in the squaring circuit may be reduced by the common-mode rejection of M1 and M2. The noise generated by the cascade transistors M3 and M4 may be relatively negligible due to the large impedance seen looking down from their source (resulting in a low effective $g_m$). The high frequency performance may therefore be somewhat improved because the feedback signal does not have to propagate through several current mirrors.

However, the linearity of amplifier 100 still has notable deficiencies. For example, because the adaptive biasing circuit 160 taps the outputs, which have already undergone nonlinearity distortions in the various amplification stages, and then feeds them back to the tail current source stage 150, nonlinearities already present in the amplifier are further propagated by the adaptive biasing of amplifier 100. Furthermore, amplifier 100 uses DC coupling, which can affect the DC biasing conditions and hence $g_m$ linearization over changes in process, voltage, and temperature (PVT). The strong dependencies of the DC operating currents on VDD and Vsh also degrade the common-mode rejection ratio (CMRR).

SUMMARY

Exemplary embodiments of the invention are directed to an amplifier with improved linearization suitable for wireless communication and other applications.

Accordingly an embodiment of the invention can include an apparatus comprising an amplifier having a transconductance stage, a tail current source stage, and an adaptive biasing stage. The transconductance stage may be configured to receive an input voltage. The tail current source stage may be configured to provide current to the transconductance stage. The adaptive biasing stage may capacitively couple the transconductance stage to the tail current source stage.

Another embodiment can include an amplifier comprising: a transconductance means for receiving an input voltage; a current providing means for providing current to the transconductance means; and an adaptive biasing means for capacitively coupling the transconductance means to the current providing means.

Another embodiment can include an integrated circuit for amplifying an input voltage, the integrated sub-circuit comprising: a first sub-circuit for receiving the input voltage; a second sub-circuit for providing current to the first sub-circuit; and a third sub-circuit for adaptively biasing the amplifier by capacitively coupling the first sub-circuit to the second sub-circuit.

Another embodiment can include a method for amplifying received signals, comprising: receiving an input voltage at a transconductance stage; providing current to the transconductance stage by a current source; and adaptively biasing the current source by capacitively coupling the transconductance stage to the current source.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As discussed above in the background, conventional adaptively biased amplifiers have notable linearity problems, stemming at least in part from tapping the amplifier outputs to provide feedback to the tail current sources. This technique further propagates already present nonlinearities. In contrast, embodiments of the invention use AC coupling capacitors to feed the input voltage, directly or indirectly, to the tail current sources. In this way, embodiments of the invention are able to provide a cleaner adaptive bias without the nonlinearity propagations of conventional adaptively biased amplifiers. The linearization scheme presented herein is also a wideband scheme facilitating operation over a broad range of frequencies. Furthermore, this design is a passive scheme that does not increase power consumption or introduce additional noise to the system, unlike the active scheme of conventional amplifier 100.

Figure 1:
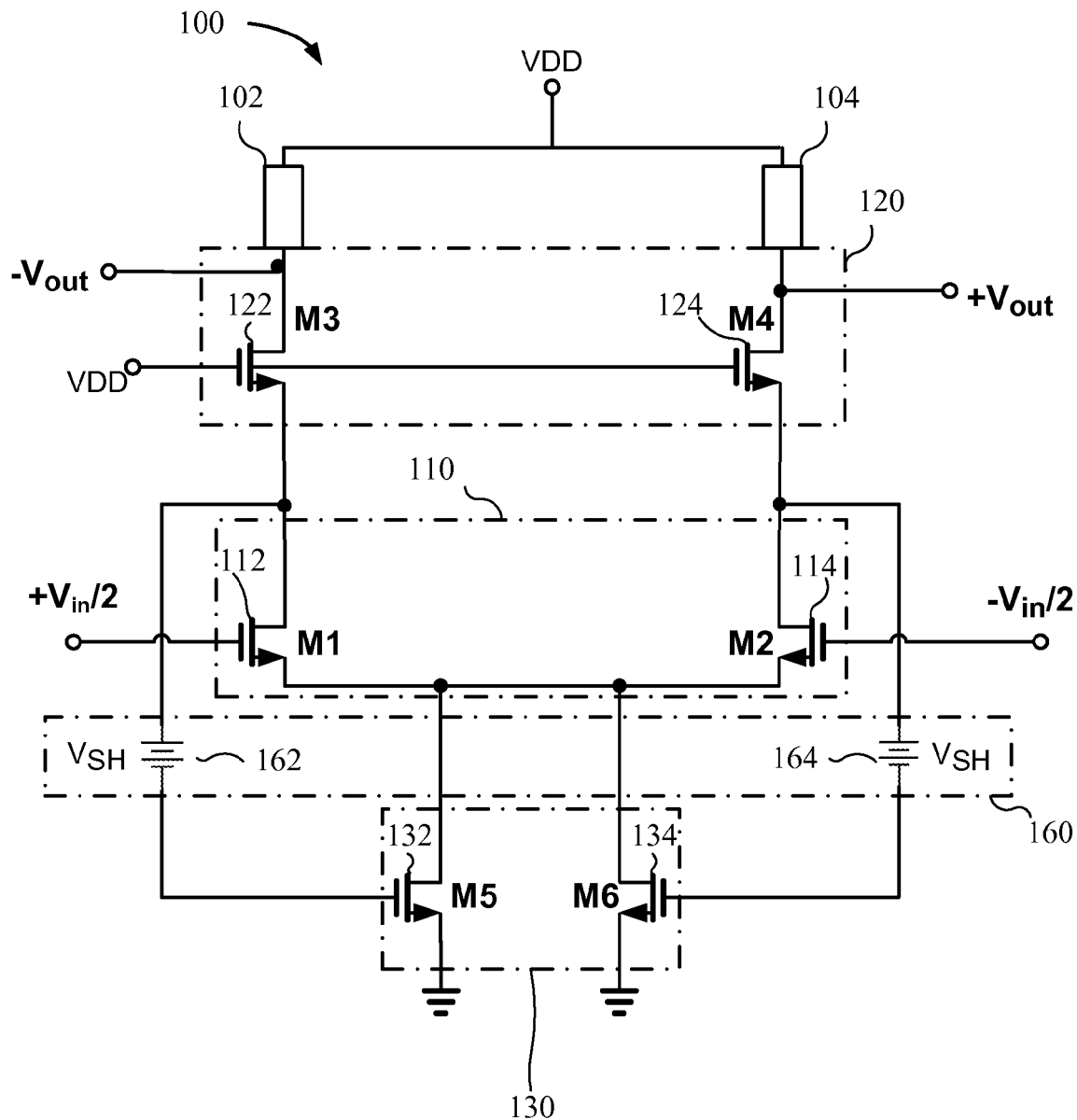
FIG. 1 illustrates an example if conventional adaptively biased, differential pair amplifier circuit.
Figure 2A:
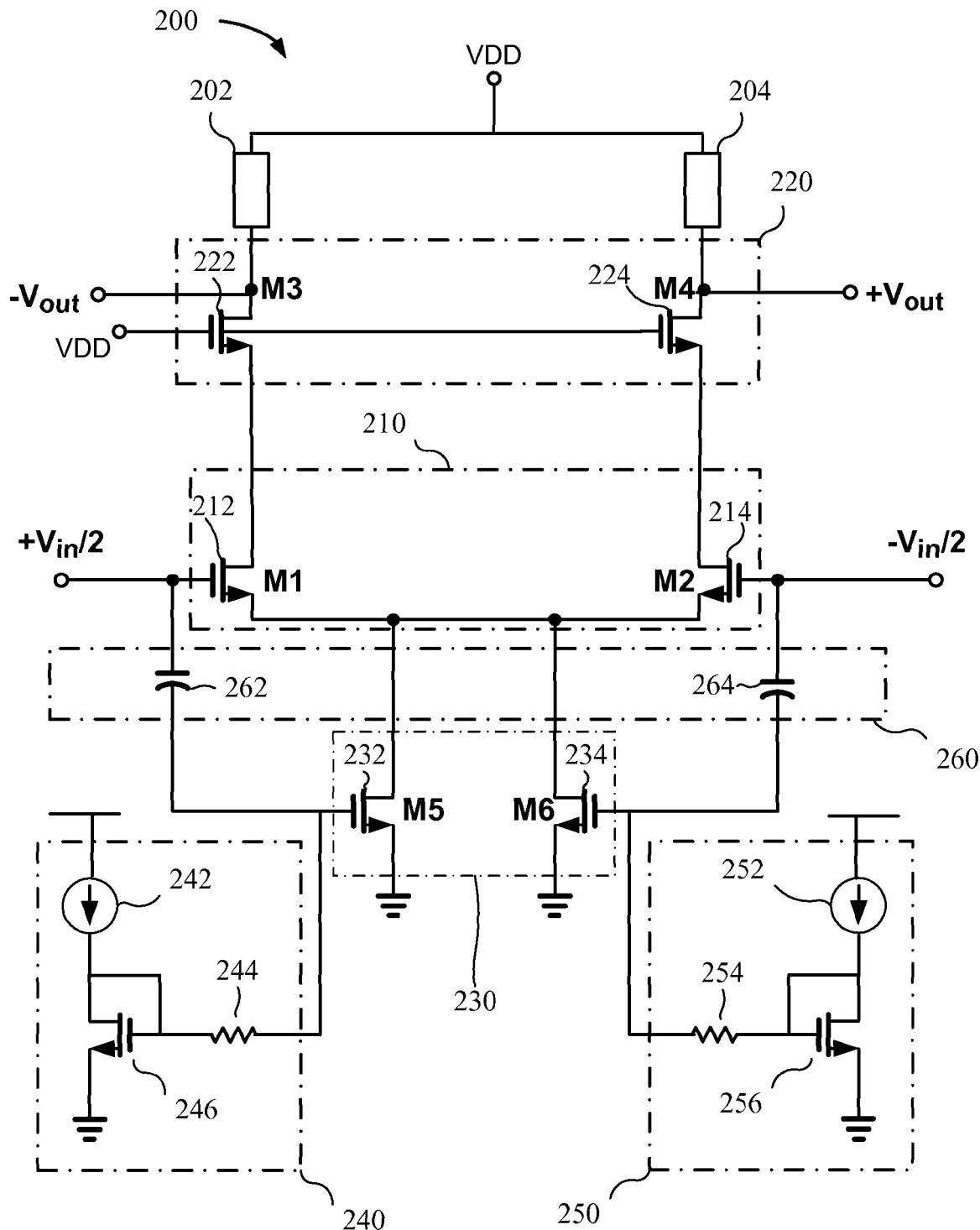
FIG. 2A illustrates an adaptively biased, differential pair amplifier circuit 200 according to an embodiment of the invention.

FIG. 2A illustrates an adaptively biased, differential pair amplifier circuit 200 according to an embodiment of the invention. Similar to the conventional amplifier 100 of FIG. 1, amplifier 200 includes a transconductance ($g_m$) stage 210, a current buffer stage 220, a tail current source stage 230, and loads 202 and 204 (e.g., resistors, inductors, etc.). In contrast to the conventional amplifier 100, however, amplifier 200 includes two DC biasing circuits 240 and 250, and a novel linearization circuit 260 instead of a conventional adaptive biasing circuit.

The $g_m$ stage 210, current buffer stage 220, tail current source stage 230, and loads 202 and 204 include analogous components to their counterparts in the conventional amplifier 100. Specifically, $g_m$ stage 210 includes two transistors 212 and 214 (e.g., JFETs), which are again referred to as M1 and M2, respectively. The gates of M1 and M2 may be referred to as input connections, and the drains of M1 and M2 may be referred to as output connections. An input voltage Vin may be applied differentially to the gates of M1 and M2. For example, in FIG. 2A, +Vin/2 is applied to the gate of M1, and −Vin/2 is applied to the gate of M2. The current buffer stage 220 includes cascade transistors 222 and 224 (e.g., JFETs), which are again referred to as M3 and M4, respectively. As in the conventional amplifier 100, M3 and M4 together make up a cascoding pair. The tail current source stage 230 includes two tail current source transistors 232 and 234 (e.g., JFETs), which are again referred to as M5 and M6, respectively.

The tail current source stage 230 is DC biased using DC biasing circuits 240 and 250, which provide a biasing voltage to the gates of transistors M5 and M6, respectively. Each of the DC biasing circuits 240 and 250 may be implemented, for example, with a current source 242 and 252, an output resistor 244 and 254, and a transistor 246 and 256 (e.g., JFETs), respectively.

The linearization circuit 260 includes two AC coupling capacitors 262 and 264 that capacitively couple the differential inputs of the input voltage Vin to the gates of transistors M5 and M6, respectively, of the tail current source stage 230. The AC coupling capacitors 262 and 264 may be on-chip capacitors, electrolytic capacitors, etc. In on-chip applications, the AC coupling capacitors may be metal-oxide-semiconductor capacitors, polysilicon-polysilicon capacitors, metal-to-metal capacitors, etc.

The circuit is wired such that loads 202 and 204 are connected to a common power supply voltage VDD at a first terminal, and to the drains of M3 and M4, respectively, at a second terminal. An output voltage Vout may be tapped from one of the second terminals of loads 202 and 204. For example, in FIG. 2A, the connection between the second terminal of load 204 and the drain of M4 is tapped to provide +Vout, and the connection between the second terminal of load 202 and the drain of M3 is tapped to provide −Vout. The gates of M3 and M4 each receive the same biasing voltage VDD. The sources of M3 and M4 are connected to the drains of M1 and M2, respectively. The gates of M1 and M2 are connected differentially to the input voltage Vin as described above. The sources of M1 and M2 are tied together and connected to the drains of M5 and M6. As described above, the gates of M5 and M6 are connected to the outputs of DC biasing circuits 240 and 250, respectively. Also as described above, the gates of M5 and M6 are further coupled to the differential input voltage through the AC coupling capacitors 262 and 264. Each of the six transistors M1 through M6 may be matched and have their bulks connected to their sources.

When the input voltage Vin increases, driving M1 to carry more current, the AC coupling capacitor 262 couples the same input voltage to the gate of M5 as is input to the gate of M1 (e.g., +Vin/2 in FIG. 2A). M5 therefore acts as an adaptively-biased AC current source. Accordingly, the current driven by M5 increases with an increase in the input voltage Vin, and M5 is able to supply more current to M1. Transistors M2 and M6, whose gates are coupled through AC coupling capacitor 264, behave similarly when the input voltage Vin is increased.

Thus, in tail current source stage 260, M5 and M6 act as constant DC current sources, but also as variable AC current sources. As described above, this allows amplifier 200 to provide a cleaner adaptive bias without affecting the DC biasing conditions, and hence, the linearization of the amplifier over changes in process, voltage, and temperature (PVT).

It will be appreciated that the techniques described above with respect to the differential amplifier of FIG. 2A can be applied to various other amplifier configurations. For Example, FIG. 2B illustrates a single-ended input amplifier according to an embodiment of the invention.

Figure 2B:
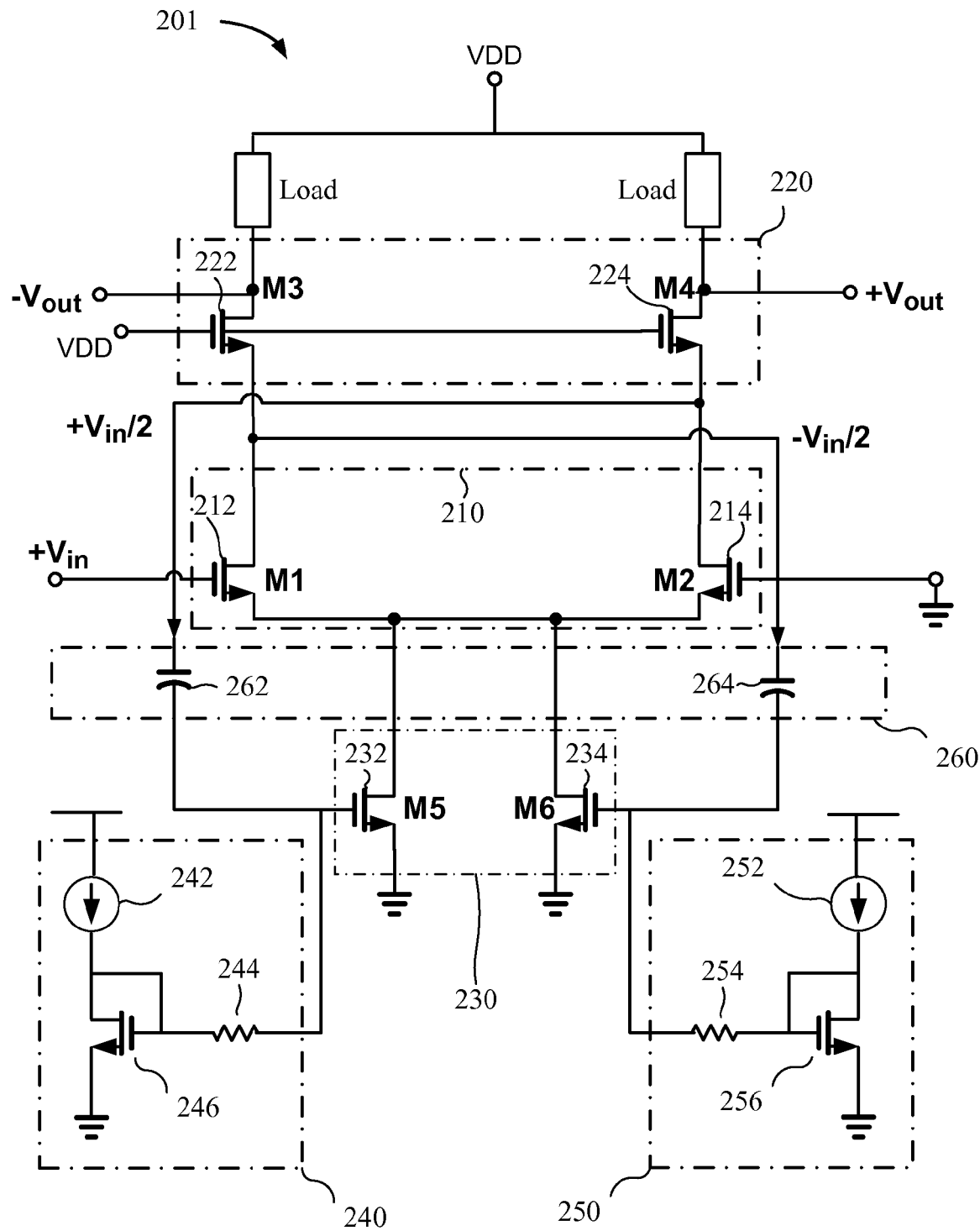
FIG. 2B illustrates a single-ended input amplifier according to an embodiment of the invention.

As shown in FIG. 2B, amplifier 201 includes a $g_m$ stage 210, current buffer stage 220, tail current source stage 230, loads 202 and 204, two DC biasing circuits 240 and 250, and a novel linearization circuit 260 similar to amplifier 200 of FIG. 2A. However, in contrast to the differential input design of FIG. 2A, the single-ended input design of FIG. 2B receives a single-ended input Vin at one of the $g_m$ stage transistors (e.g., transistor 212) and has the other $g_m$ stage transistor (e.g., transistor 214) coupled to a ground voltage. Accordingly, to adaptively bias the tail current source stage 230, linearization circuit 260 of FIG. 2B capacitively couples the input voltage Vin from the drains of transistors 212 and 214, as compared to the gates of transistors 212 and 214 in the differential input design of FIG. 2A. Specifically, the drains of transistors 212 and 214 are cross-coupled to the AC coupling capacitors 262 and 264 such that the drain of transistor 212 is coupled to AC coupling capacitor 264, and the drain of transistor 214 is coupled to AC coupling capacitor 262. Thus, in the single-ended input design of FIG. 2B, AC coupling capacitor 212 receives a voltage of approximately +Vin/2, and AC coupling capacitor 214 receives a voltage of approximately −Vin/2, which is the same as the differential input design of FIG. 2A.

As discussed in the background, the linearity of an amplifier can be quantified by measuring its input-referred third-order intercept point (IIP3). This may be done, for example, using a standard two-tone test, as is well known in the art. In a two-tone test, two sinewaves at slightly varying fundamental frequencies are input to the amplifier. Because the amplifier is not perfectly linear, in addition to outputting two desired signals corresponding to the two input frequencies, the amplifier also produces two third-order intermodulation products. The third-order intermodulation products are the result of inter-mixing (or modulating) the two-tone inputs by the nonlinearities in the amplifier. The output signals and third-order intermodulation products are plotted versus the input frequencies, and the IIP3 is measured as the theoretical point where the desired output signal and the third-order products become equal in amplitude. Because the third-order intermodulation products are often very close in frequency to the desired signals, and therefore cannot be removed easily by filtering, the two-tone test provides a good measure of a system's linearity.

Figure 3:
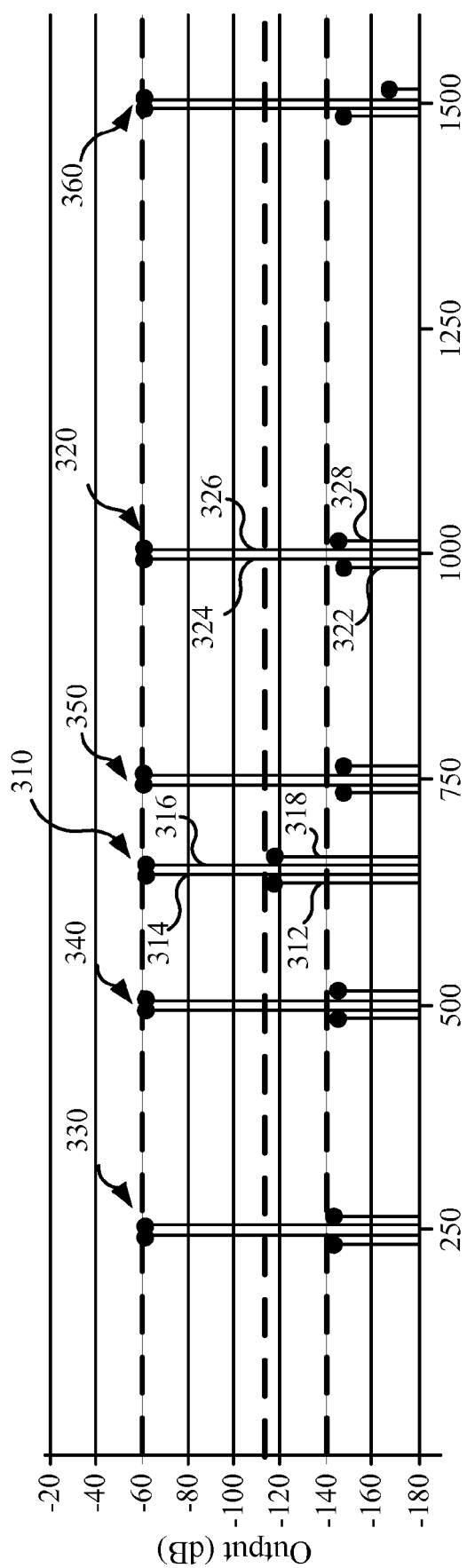
FIG. 3 illustrates the performance of an adaptively biased amplifier according to an embodiment of the invention under a standard two-tone test.

FIG. 3 illustrates the performance of an adaptively biased amplifier according to an embodiment of the invention under a standard two-tone test. In FIG. 3, a two-tone test was performed on an adaptively biased amplifier implementing the techniques of FIGS. 2A and 2B with AC coupling capacitance values of 5 pF. The two-tone test was performed over a range of frequencies to demonstrate wideband capabilities. Specifically, the two-tone test was performed for tones centered at the exemplary frequencies of 250 MHz (tone group 330), 500 MHz (tone group 340), 750 MHz (tone group 350), 1000 MHz (tone group 320), and 1500 MHz (tone group 360). For comparison, a two-tone test was also performed for tones centered at a frequency of approximately 650 MHz (tone group 310) for a conventional differential amplifier without any adaptive biasing. For simplicity, only first and third order tones are shown in FIG. 3.

Tone group 310 corresponding to outputs of a conventional differential amplifier includes third-order tone 312, first-order tone 314, first-order tone 316, and third-order tone 318. First-order tones 314 and 316 correspond to the desired amplifier outputs of the two input tones, and third-order tones 312 and 318 correspond to third-order harmonics arising due to nonlinearities in the amplifier. The IIP3 of the conventional amplifier as derived from tone group 310 is approximately 0 dBm.

Tone group 320 corresponding to outputs of an adaptively biased amplifier according to an embodiment of the invention includes third-order tone 322, first-order tone 324, first-order tone 326, and third-order tone 328. First-order tones 324 and 326 correspond to the desired amplifier outputs of the two input tones, and third-order tones 322 and 328 correspond to third-order harmonics arising due to nonlinearities in the amplifier. Tone groups 330, 340, 350, and 360 can be interpreted in a similar manner.

As is readily apparent from FIG. 3, the third-tones 322 and 328 output from the adaptively biased amplifier are significantly reduced as compared to the third-order tones 312 and 318 output from the conventional differential amplifier. The IIP3 of the adaptively biased amplifier as derived from tone group 310 is approximately 12 dBm. Furthermore, the third-order tones of tone groups 320 through 360 are relatively constant.

Accordingly, as shown in FIG. 3, an adaptively biased amplifier according to at least one embodiment of the invention may provide a more linearized (i.e., improved IIP3) output than a conventional differential amplifier. Furthermore, the improved linearization is not limited to a narrow frequency band, but is sustained over a relatively wide frequency range.

Different AC capacitance values for the AC coupling capacitors will provide different linearization capabilities. Table 1 shows simulated IIP3 data under a standard two-tone test for different capacitance values of the AC coupling capacitors in the range of 2 pF to 8 pF. However, it will be appreciated that the appropriate range of AC coupling capacitor values depends on the physical sizes chosen for the transistors of the tail current source (e.g., M5 and M6 of FIGS. 2A and 2B), as the gate-to-source capacitances of the tail current sources scale with their physical size. Thus, the values in Table 1 are shown for exemplary purposes only, and not intended to be limiting. The simulations of Table 1 were performed for input tones centered around approximately 700 MHz.

TABLE 1

| AC Coupling Capacitor Capacitance (pF) | IIP3 (dBm) |
|---|---|
| 2 | +5 |
| 3 | +9 |
| 4 | +17 |
| 5 | +12 |
| 6 | +9 |
| 7 | +8 |
| 8 | +7 |

The amplifier circuits and other linearized active circuits described herein may be used for various applications such as communication, networking, computing, consumer electronics, and so on. These linearized active circuits may be used in wireless communication systems such as a Code Division Multiple Access (CDMA) system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a single-carrier FDMA (SC-FDMA) system, a wireless local area network (WLAN), and so on. The amplifier may be used as a low noise amplifier (LNA), a variable gain amplifier (VGA), a power amplifier (PA), a transimpedance amplifier, and so on. The CDMA system may implement cdma2000, Wideband CDMA (W-CDMA), and/or other CDMA radio access technologies.

Figure 4:
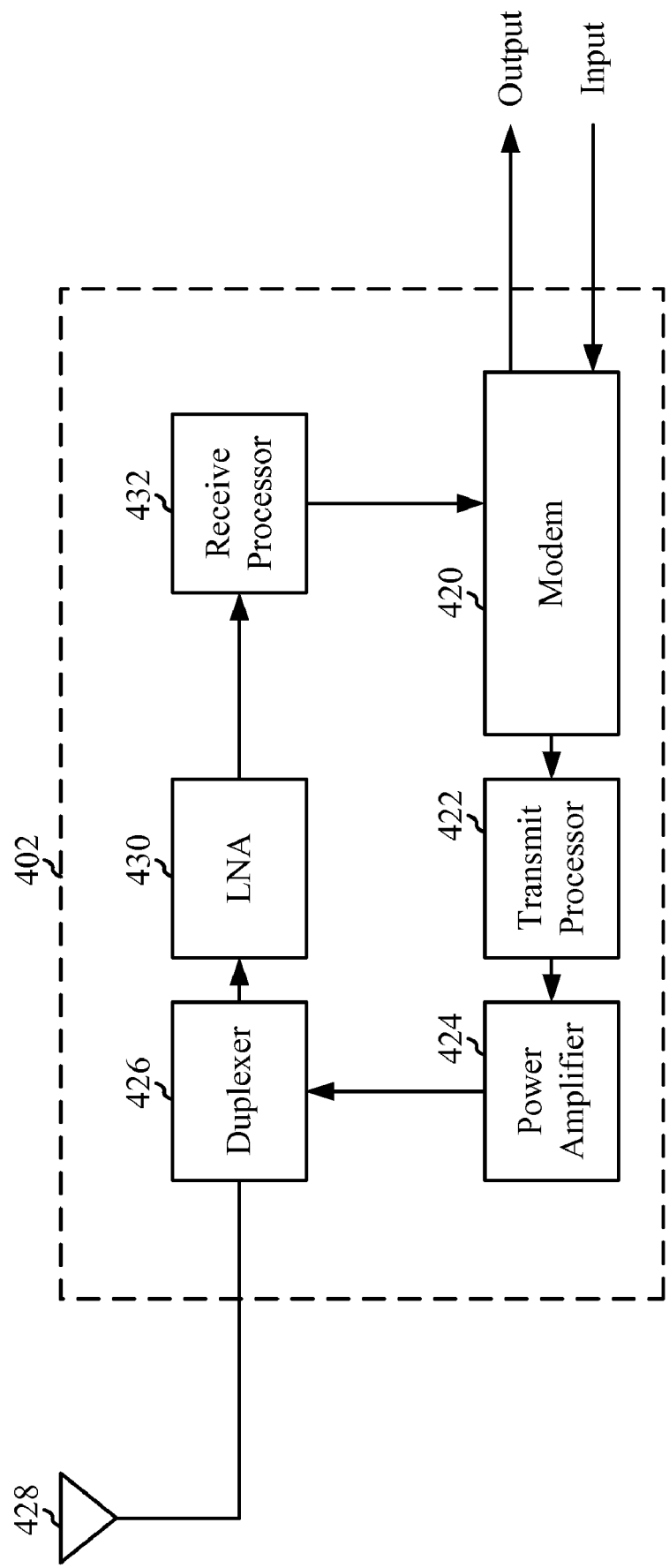
FIG. 4 is a block diagram illustrating an example wireless communication device (WCD).

FIG. 4 is a block diagram illustrating an example wireless communication device (WCD) 402. The WCD 402 uses a transmit signal path and a receive signal path that interfaces with an antenna 428. In the transmit signal path, a modem 420 may receive an input signal from an encoder (not shown) that encodes user input, for example, from a microphone or a keypad. The modem 420 modulates the user input to baseband signals. A transmit processor 422 performs baseband-to-radio-frequency (RF) signal processing to produce an RF signal to be transmitted by the WCD 402. For example, the transmit processor 422 may upconvert the baseband signals to an RF signal in the CDMA frequency band, and amplify the baseband signals to provide signal drive capability to a power amplifier 424. The baseband quadrature signals may first be upconverted to an intermediate frequency before being upconverted to the CDMA frequency band. Alternatively, the baseband quadrature signals may be upconverted directly to the CDMA frequency band without first being upconverted to the intermediate frequency. In either case, the power amplifier 424 further amplifies the RF signal and provides the amplified signal to a duplexer 426. The duplexer 426 then provides the RF signal to antenna 428, which transmits the RF signal.

In the receive signal path, the duplexer 426 receives an RF signal. Because the RF signal is of relatively low power compared to the baseband signals, an LNA 430 amplifies the RF signal. A receive processor 432 then performs RF-to-baseband signal processing to produce baseband signals to be demodulated by the modem 420. For example, the receive processor 432 may downconvert the RF signal to appropriate baseband signals. The RF signal may first be downconverted to an intermediate frequency before being downconverted to the baseband frequency. Alternatively, the RF signal may be downconverted directly to the baseband frequency without first being downconverted to the intermediate frequency. In either case, the modem 420 demodulates the baseband signals to produce an output signal that is decoded and provided to an output device, e.g., a speaker or a display screen.

With the received RF signal having low power, it is important that the RF front-end, including the LNA 430, exhibit a high degree of linearity. Accordingly, LNA 430 may be implemented according to any of the various embodiments of the invention, for example, adaptively biased amplifier 200 of FIG. 2A or 202 of FIG. 2B.

Figure 5:
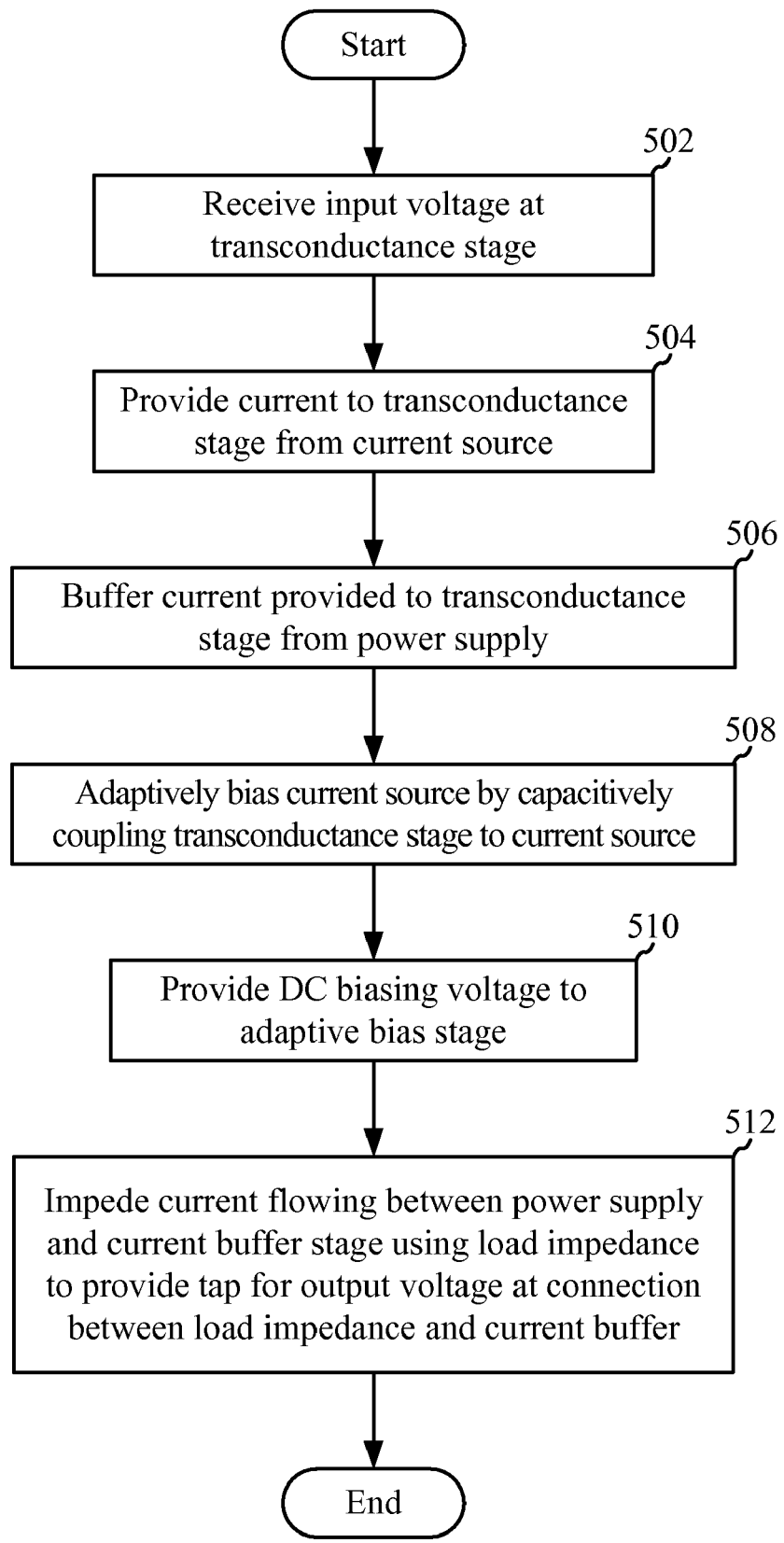
FIG. 5 is a flow diagram illustrating a method for amplifying received signals according to an embodiment of the invention.

In view of the foregoing, it will be appreciated that embodiments of the invention can also include an integrated circuit with sub-circuits for performing the functions, sequence of actions and/or algorithms described herein. It will also be appreciated that embodiments of the invention can include methods for performing the functions, sequence of actions and/or algorithms described herein. For example, FIG. 5 is a flow diagram illustrating a method for amplifying received signals according to an embodiment of the invention. As shown, the method may include receiving an input voltage at a transconductance stage (block 502), providing current to the transconductance stage by a current source (block 504), buffering current provided to the transconductance stage from a power supply (block 506), adaptively biasing the current source by capacitively coupling the transconductance stage to the current source (block 508), providing a DC biasing voltage to an adaptive bias stage (block 510), and impeding current flowing between the power supply and the current buffer stage using at least one load impedance to provide a tap for at least one output voltage at the connection between the load impedance and the current buffer (block 512).

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising an amplifier, wherein the amplifier comprises:
   a common-source transconductance stage configured to receive an input voltage;
   a tail current source stage configured to provide current to the transconductance stage;
   a current buffer stage coupled to the transconductance stage and configured to buffer current provided to the transconductance stage from a power supply; and
   an adaptive biasing stage configured to capacitively couple the transconductance stage to the tail current source stage.

2. The apparatus of claim 1,
   wherein the transconductance stage comprises first and second transistors, the adaptive biasing stage being configured to capacitively couple gates of the first and second transistors to biasing inputs of the tail current source stage based on a differential input voltage received at the gates of the first and second transistors.

3. The apparatus of claim 2, wherein the adaptive biasing stage includes AC coupling capacitors, each AC coupling capacitor connected at a first terminal to a gate of one of the first and second transistors of the transconductance stage, and connected at a second terminal to a biasing input of the tail current source stage.

4. The apparatus of claim 3, wherein each AC coupling capacitor has a capacitance in the range of about 2 pF to about 8 pF.

5. The apparatus of claim 3, wherein each AC coupling capacitor has a capacitance of about 4 pF to about 5 pF.

6. The apparatus of claim 1, wherein the transconductance stage comprises first and second transistors, the adaptive biasing stage being configured to capacitively cross-couple drains of the first and second transistors to biasing inputs of the tail current source stage based on a single-ended input voltage received at a gate of one of the first and second transistors.

7. The apparatus of claim 6, wherein the adaptive biasing stage includes AC coupling capacitors, each AC coupling capacitor connected at a first terminal to a drain of one of the first and second transistors of the transconductance stage, and connected at a second terminal to a biasing input of the tail current source stage.

8. The apparatus of claim 7, wherein each AC coupling capacitor has a capacitance in the range of about 2 pF to about 8 pF.

9. The apparatus of claim 7, wherein each AC coupling capacitor has a capacitance of about 4 pF to about 5 pF.

10. The apparatus of claim 1, further comprising:
    at least one DC biasing circuit coupled to a biasing input of the tail current source stage and configured to provide a DC biasing voltage to the tail current source stage.

11. The apparatus of claim 1, further comprising:
    load impedances connected between the power supply and the current buffer stage, wherein at least one output voltage is tapped from the connection between at least one of the load impedances and the current buffer stage.

12. The apparatus of claim 11, wherein the load impedances are resistors.

13. The apparatus of claim 11, wherein the apparatus is a wireless communication device.

14. An amplifier, comprising:
    common-source transconductance means for receiving an input voltage;
    current providing means for providing current to the transconductance means;
    current buffer means for buffering current provided to the transconductance means from a power supply; and
    adaptive biasing means for capacitively coupling the transconductance means to the current providing means.

15. The amplifier of claim 14, wherein the adaptive biasing means couples input connections of the transconductance means to biasing inputs of the current providing means based on a differential input voltage.

16. The amplifier of claim 14, wherein the adaptive biasing means cross-couples output connections of the transconductance means to biasing inputs of the current providing means based on a single-ended input voltage.

17. The amplifier of claim 14, wherein the adaptive biasing means includes a capacitance in the range of about 2 pF to about 8 pF.

18. The amplifier of claim 14, wherein the adaptive biasing means includes a capacitance of about 4 pF to about 5 pF.

19. The amplifier of claim 14, further comprising:
DC biasing means for providing a DC biasing voltage to the adaptive biasing means.

20. The amplifier of claim 14, further comprising:
impedance means for impeding current flowing between the power supply and the current buffer means, wherein at least one output voltage is tapped from the connection between the impedance means and the current buffer means.

21. An integrated circuit for amplifying an input voltage, the integrated circuit comprising:
a first common-source sub-circuit for receiving the input voltage;
a second sub-circuit for providing current to the first sub-circuit;
a fourth sub-circuit for buffering current provided to the first sub-circuit from a power supply; and
a third sub-circuit for adaptively biasing the amplifier by capacitively coupling the first sub-circuit to the second sub-circuit.

22. The integrated circuit of claim 21, wherein the third sub-circuit couples input connections of the first sub-circuit to biasing inputs of the third sub-circuit based on a differential input voltage.

23. The integrated circuit of claim 21, wherein the third sub-circuit cross-couples output connections of the first sub-circuit to biasing inputs the third sub-circuit based on a single-ended input voltage.

24. The integrated circuit of claim 21, wherein the third sub-circuit provides a capacitance in the range of about 2 pF to about 8 pF.

25. The integrated circuit of claim 21, wherein the third sub-circuit provides a capacitance of about 4 pF to about 5 pF.

26. The integrated circuit of claim 21, further comprising:
a fifth sub-circuit providing a DC biasing voltage to the third sub-circuit.

27. The integrated circuit of claim 21, further comprising:
a sixth sub-circuit for impeding current flowing between the power supply and the fourth sub-circuit, wherein at least one output voltage is tapped from the connection between the sixth sub-circuit and the fourth sub-circuit.

28. A method for amplifying received signals, comprising:
receiving an input voltage at a common-source transconductance stage;
providing current to the transconductance stage by a current source;
buffering current provided to the transconductance stage from a power supply; and
adaptively biasing the current source by capacitively coupling the transconductance stage to the current source.

29. The method of claim 28, wherein adaptively biasing includes coupling input connections of the transconductance stage to biasing inputs of the current source based on a differential input voltage.

30. The method of claim 28, wherein adaptively biasing includes coupling output connections of the transconductance stage to biasing inputs of the current source based on a single-ended input voltage.

31. The method of claim 28, further comprising:
providing a DC biasing voltage to an adaptive bias stage.

32. The method of claim 28, further comprising:
impeding current flowing between the power supply and the current buffer stage, wherein at least one output voltage is tapped from the connection between at least one load impedance and a current buffer.

33. A non-transitory processor-readable storage medium having stored thereon processor-executable software instructions configured to cause an electronic device processor to perform operations comprising::
receiving an input voltage at a common-source transconductance stage;
providing current to the transconductance stage by a current source;
buffering current provided to the transconductance stage from a power supply; and
adaptively biasing the current source by capacitively coupling the transconductance stage to the current source.

34. The non-transitory processor-readable storage medium of claim 33, wherein the stored processor-executable software instructions are configured to cause the electronic device processor to perform operations further comprising:
coupling input connections of the transconductance stage to biasing inputs of the current source based on a differential input voltage.

35. The non-transitory processor-readable storage medium of claim 33, wherein the stored processor-executable software instructions are configured to cause the electronic device processor to perform operations further comprising:
coupling output connections of the transconductance stage to biasing inputs of the current source based on a single-ended input voltage.

36. The non-transitory processor-readable storage medium of claim 33, wherein the stored processor-executable software instructions are configured to cause the electronic device processor to perform operations further comprising:
providing a DC biasing voltage to an adaptive bias stage.

37. The non-transitory processor-readable storage medium of claim 33, wherein the stored processor-executable software instructions are configured to cause the electronic device processor to perform operations further comprising:
impeding current flowing between the power supply and the current buffer stage, wherein at least one output voltage is tapped from the connection between at least one load impedance and a current buffer.

* * * * *